(12) United States Patent
Ko et al.

(10) Patent No.: US 9,362,005 B2
(45) Date of Patent: Jun. 7, 2016

(54) SEMICONDUCTOR DEVICE FOR PARALLEL BIT TEST AND TEST METHOD THEREOF

(71) Applicant: SK hynix Inc., Gyeonggi-do (KR)

(72) Inventors: Jae-Bum Ko, Gyeonggi-do (KR); Sang-Jin Byeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 114 days.

(21) Appl. No.: 14/477,618

(22) Filed: Sep. 4, 2014

(65) Prior Publication Data

US 2015/0235714 A1   Aug. 20, 2015

(30) Foreign Application Priority Data

Feb. 20, 2014   (KR) ......................... 10-2014-0019677

(51) Int. Cl.
| | |
|---|---|
| *G01R 31/02* | (2006.01) |
| *G11C 29/26* | (2006.01) |
| *G11C 8/12* | (2006.01) |
| *G11C 29/56* | (2006.01) |

(52) U.S. Cl.
CPC ........ *G11C 29/26* (2013.01); *G11C 8/12* (2013.01); *G11C 2029/2602* (2013.01); *G11C 2029/5602* (2013.01)

(58) Field of Classification Search
CPC ........ G11C 29/12; G11C 29/26; G11C 29/48; G11C 29/46; G11C 7/1002; G11C 7/1006; G11C 7/4093; G11C 7/4096
See application file for complete search history.

(56) References Cited

U.S. PATENT DOCUMENTS

| 5,822,333 | A  | * | 10/1998 | Foss ........................ | G11C 29/12 714/719 |
| 6,457,141 | B1 | * | 9/2002  | Kim ......................... | G11C 5/066 714/30 |
| 6,654,299 | B2 | * | 11/2003 | Otsuka ...................... | G11C 7/1006 365/189.03 |
| 2007/0094554 | A1 | * | 4/2007 | Versen ..................... | G11C 29/46 714/718 |
| 2009/0327573 | A1 | * | 12/2009 | Jang ........................ | G11C 5/066 711/5 |

FOREIGN PATENT DOCUMENTS

KR   1020090094620   9/2009

* cited by examiner

*Primary Examiner* — Minh N Tang
(74) *Attorney, Agent, or Firm* — IP & T Group LLP (57) ABSTRACT

A semiconductor device includes a plurality of memory chips and a plurality of signal selection units respectively corresponding to the plurality of memory chips, and suitable for commonly transferring test data signals from an external to a corresponding one of the plurality of memory chips during a common test mode, wherein one or more of the plurality of signal selection units may transfer the test data signals from the external to corresponding ones of the plurality of memory chips during an individual test mode, and wherein the semiconductor device may be set to the common test mode when a common test signal is enabled, and set to the individual test mode when both the common test signal and a test control signal are enabled.

15 Claims, 4 Drawing Sheets

SEMICONDUCTOR DEVICE FOR PARALLEL BIT TEST AND TEST METHOD THEREOF

CROSS-REFERENCE TO RELATED APPLICATIONS

The present application claims priority of Korean Patent Application No. 10-2014-0019677, filed on Feb. 20, 2014, which is incorporated herein by reference in its entirety.

BACKGROUND

1. Field

Various exemplary embodiments of the present invention relate to a semiconductor design technology and, more particularly, to a semiconductor device for a parallel test and a test method thereof.

2. Description of the Related Art

Semiconductor devices require various tests for verification of intended characteristics and functions during their design and fabrication.

One common test is a parallel bit test (PBT), which is widely used because it is accomplished relatively quickly.

During an existing test operation, data outputted from a single bank is compressed through a logic operation and the compressed data is outputted to an external device. However, according to the PBT for increasing test efficiency, a plurality of the test operations that is generally for a single bank is performed simultaneously and in parallel for two or more banks, and data is outputted in synchronization with a clock signal.

The PBT for performing sequential read operations after an active operation improves the speed of the test but may influence measuring the RAS to CAS delay time 'tRCD' for each read command signal. For example, during the PBT, first and second channels are simultaneously selected in response to a channel control signal, and a test is simultaneously performed on first and second banks, which are coupled to the first and second channels, respectively. During the PBT, when the RAS to CAS delay time 'tRCD' is requested for measurement, an additional sequence is required. In the additional sequence for measuring the requested RAS to CAS delay time 'tRCD' for each of the first and second channels, a signal for simultaneously selecting the first and second channels should be deactivated, or a signal for separately selecting the first channel or the second channel should be applied. Due to the additional sequence, lost time may occur and it may be difficult to correctly measure parameters such as the RAS to CAS delay time 'tRCD' during the PBT.

Moreover, when parameters relating to operation characteristics of the semiconductor device(e.g., RAS precharge time 'tRP', column address access time 'tAA', write recovery time 'tWR' as well as the RAS to CAS delay time 'tRCD') are incorrectly measured, serious concerns may arise in subsequent tests.

SUMMARY

Various exemplary embodiments of the present invention are directed to a semiconductor device capable of supporting a parallel bit test (PBT) and a test method thereof for improving the measurement reliability of parameter characteristics through the PBT.

In accordance with an exemplary embodiment of the present invention, a semiconductor device may include: a plurality of memory chips; and a plurality of signal selection units respectively corresponding to the plurality of memory chips, and suitable for commonly transferring test data signals from an external (an outside source or device) to a corresponding one of the plurality of memory chips during a common test mode, wherein one or more of the plurality of signal selection units may transfer the test data signals from the external to the corresponding ones of the plurality of memory chips during an individual test mode, and wherein the semiconductor device may be set to the common test mode when a common test signal is enabled, and set to the individual test mode when both the common test signal and a test control signal are enabled.

The test control signal may be a row test signal that is initially disabled during a column operation, which one of the plurality of memory chips performs when column test signals are enabled, and the test control signal may be the column test signals initially disabled during a row operation, which one of the plurality of memory chips performs when the row test signals are enabled.

The column operation may be one of a write and read operation, and the row operation may be an active operation.

One of the plurality of memory chips may be selected in response to chip select signals, and one of the plurality of signal selection units may transfer the test data signal to a corresponding one of the plurality of memory chips selected in response to chip select signals during the individual test mode.

In accordance with another exemplary embodiment of the present invention, a semiconductor device may include: a memory device; and a test device suitable for transferring test data signals to the memory device during a test mode. The memory device may include: a plurality of memory chips; and a plurality of signal selection units respectively corresponding to the plurality of memory chips, and suitable for commonly transferring test data signals from the test device to a corresponding one of the plurality of memory chips during a common test mode, wherein one or more of the plurality of signal selection units may transfer the test data signals from the test device to corresponding ones of the plurality of memory chips during an individual test mode, and wherein the semiconductor device may be set to the common test mode when a common test signal is enabled, and set to the individual test mode when both the common test signal and a test control signal are enabled.

The test control signal may be one of the row test signals initially disabled during a column operation, which one of the plurality of memory chips performs when column test signals are enabled, and the test control signal may be the column test signals initially disabled during a row operation, which one of the plurality of memory chips performs when the row test signals are enabled.

The column operation may be one of write and read operations, and the row operation may be an active operation.

One of the plurality of memory chips may be selected in response to chip select signals, and one of the plurality of signal selection units may transfer the test data signal to a corresponding one of the plurality of memory chips selected in response to chip select signals during the individual test mode.

In accordance with another exemplary embodiment of the present invention, a method of testing a semiconductor device having a plurality of memory chips, and a plurality of signal selection units respectively corresponding to the plurality of memory chips, a testing method may include: setting the semiconductor device to a common test mode when a common test signal is enabled; at the plurality of signal selection units, commonly transferring test data signals from an external (e.g., an outside source or external device) to a corresponding one of the plurality of memory chips during the common test mode; setting the semiconductor device to an individual test mode when both the common test signal and a test control signal are enabled; and at one or more of the plurality of signal selection units, transferring the test data signals from the external to corresponding ones of the plurality of memory chips during an individual test mode.

The test control signal may be one of the row test signals initially disabled during a column operation, which one of the plurality of memory chips performs when column test signals are enabled, and the test control signal may be the column test signals initially disabled during a row operation, which one of the plurality of memory chips performs when the row test signals are enabled.

The column operation may be one of the write and read operations, and the row operation may be an active operation.

One of the plurality of memory chips may be selected in response to chip select signals, and the transferring of the test data signals at one or more of the plurality of signal selection units may transfer the test data signal at one of the plurality of signal selection units to a corresponding one of the plurality of memory chips selected in response to chip select signals during the individual test mode.

The transferring of the test data signals at one or more of the plurality of signal selection units may transfer the enabled column test signals at each of plurality of signal selection units in response to the test control signal, which is one of row test signals initially disabled, and becomes enabled during the column operation, and the transferring of the test data signals at one or more of the plurality of signal selection units may transfer the enabled row test signals at each plurality of signal selection units in response to the test control signal, which is one of column test signals initially disabled that becomes enabled during the row operation.

In accordance with the various exemplary embodiments of the present invention, during the individual test mode, the command and address signal applied through the test channel may be transferred to the first memory chip or the second memory chip in response to the individual control signal.

Also, in accordance with the various exemplary embodiments of the present invention, during the common test mode, the command and address signal applied through the test channel may be commonly transferred to the first memory chip and the second memory chip.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

The drawings are not necessarily to scale and, in some instances, proportions may have been exaggerated in order to clearly illustrate features of the embodiments. In this specification, specific terms have been used. The terms are used to describe the present invention and are not used to qualify the sense or limit the scope of the present invention.

It is also noted that in this specification, 'and/or' represents that one or more of components arranged before and after 'and/or' is included. Furthermore, "connected/coupled" refers to one component not only directly coupling another component but also indirectly coupling another component through an intermediate component. In addition, a singular form may include a plural form, and vice versa, as long as it is not specifically mentioned. Furthermore, 'include/comprise' or 'including/comprising' used in the specification represents that one or more components, steps, operations, and elements may exist or be added.

Figure 1:
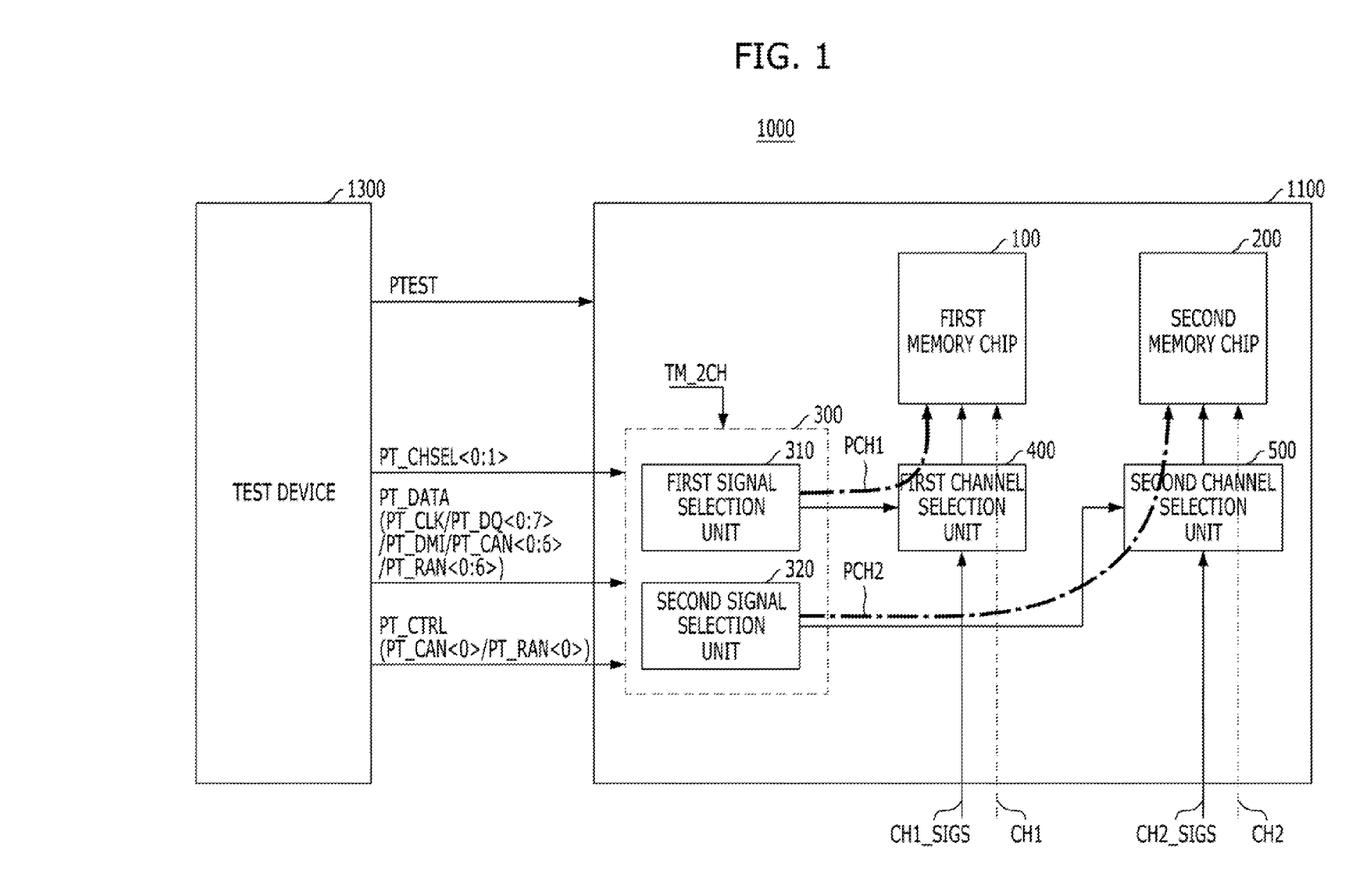
FIG. 1 is a block diagram illustrating a semiconductor device in accordance with an exemplary embodiment of the present invention.

FIG. 1 is a block diagram illustrating a semiconductor device 1000 in accordance with an exemplary embodiment of the present invention.

Referring to FIG. 1, the semiconductor device 1000 may include a memory device 1100 and a test device 1300.

The memory device 1100 may receive a test mode signal PTEST, individual control signals PT_CHSEL<0:1>, test data signals PT_DATA, and a test control signal PT_CTRL from the test device 1300. The memory device may include a first memory chip 100, a second memory chip 200, a plurality of signal selection units 300, a first channel selection unit 400, and a second channel selection unit 500.

The first and second memory chips 100 and 200 may share an input/output line. The first and second memory chips 100 and 200 may communicate with an external device through first and second channels CH1 and CH2, respectively. The first and second channels CH1 and CH2 may include a plurality of signal lines, respectively. First and second normal signals CH1_SIGS and CH2_SIGS for the first and second memory chips 100 and 200, respectively, may be applied from an external device to the first and second memory chips 100 and 200 through the first and second channels CH1 and CH2 during a normal operation mode.

The first and second memory chips 100 and 200 may also communicate with the test device 1300 through first and second test channels PCH1 and PCH2, respectively. The first and second memory chips 100 and 200 may receive the test data signals PT_DATA from the test device 1300 through the first and second test channels PCH1 and PCH2, respectively. The first and second test channels PCH1 and PCH2 may share the first and second selection units 400 and 500 as routing elements with the first and second channels CH1 and CH2, and may deliver the test data signals PT_DATA from the test device 1300 to the first and second memory chips 100 and 200. The test data signals PT_DATA may be transferred from the test device 1300 during a chip test before packaging and stacking. Although not shown in FIG. 1, each of the first and second memory chips 100 and 200 may include a bank coupled to a corresponding one of the first and second channels CH1 and CH2, and the signals CH1_SIGS and CH2_SIGS may be inputted or outputted through the first and second channels CH1 and CH2.

The test data signals PT_DATA may include a command, an address, and data in a test signal. The test data signals PT_DATA may include a memory clock test signal PT_CLK, a data input/output test signal PT_DQ<0:7>, and a data masking test signal PT_DMI. The data masking test signal PT_DMI may be used for testing of a data mask function of a memory. The memory having the data mask function may prevent data from being written to a memory cell by masking a signal inputted to a write driver, and preventing data on a global line from being transferred to a local line when a data mask signal is enabled. The commands in the test signal included in the test data signals PT_DATA may be categorized into active commands, which are used for accessing a row region of a memory, and write and read commands, which are used for accessing a column region of the memory. Therefore, the test data signals PT_DATA may include row test signals PT_RAN<0:6>, which are test signals for the row commands and row addresses, and column test signals PT_CAN<0:6>, which are test signals for the column commands and the column addresses.

The memory device 1100 may enter a test mode upon receiving the test mode signal PTEST from the test device 1300.

The test control signal PT_CTRL may be used for the individual control of each of the first and second memory chips 100 and 200 during a common test of the first and second memory chips 100 and 200. The test control signal PT_CTRL may be one of the row test signals PT_RAN<0:6> and the column test signals PT_CAN<0:6>.

For example, the test control signal PT_CTRL may be a disabled one of the row test signals PT_RAN<0:6> and the column test signals PT_CAN<0:6>. During an active operation in the test mode in response to the active command, which is a row command, the row test signals PT_RAN<0:6> for the row command and row address may be enabled while the column test signals PT_CAN<0:6> for the column command and the column address may be disabled. The test control signal PT_CTRL may be one of the disabled column test signals PT_CAN<0:6>, for example, the column test signal PT_CAN<0>. During write or read operations in the test mode in response to the write or read command, which is a column command, the column test signals PT_CAN<0:6> for the column command and the column address may be enabled while the row test signals PT_RAN<0:6> for the row command and row address may be disabled. The test control signal PT_CTRL may be one of the disabled row test signals PT_RAN<0:6>, for example, the row test signal PT_RAN<0>.

That is, the test control signal PT_CTRL may be one of the disabled row test signals PT_RAN<0:6> during the column operation, which is performed by the enabled column test signals PT_CAN<0:6>. On the other hand, the test control signal PT_CTRL may be one of the disabled column test signals PT_CAN<0:6> during the row operation, which is performed by the enabled row test signals PT_RAN<0:6>.

For example, the plurality of signal selection units 300 may include first and second signal selection units 310 and 320 respectively corresponding to the first and second memory chips 100 and 200. Each of the first and second signal selection units 310 and 320 may receive a common test signal TM_2CH, the individual control signals PT_CHSEL<0:1>, the test data signals PT_DATA, and the test control signal PT_CTRL.

The plurality of signal selection units 300 may set the memory device 1100 to a common test mode in response to the test control signal PT_CTRL, which is one of the disabled row test signals PT_RAN<0:6> during the column operation, and the disabled column test signals PT_CAN<0:6> during the row operation, and the enabled common test signal TM_2CH. During the common test mode, all of the first and second signal selection units 310 and 320 may commonly transfer the test data signals PT_DATA from the test device 1300 to the first and second memory chips 100 and 200 through the first and second test channels PCH1 and PCH2, respectively, regardless of the individual control signals PT_CHSEL<0:1>.

Further, the plurality of signal selection units 300 may set the memory device 1100 to an individual test mode when the test control signal PT_CTRL is enabled, and the common test signal TM_2CH is enabled. During the individual test mode, each of the first and second signal selection units 310 and 320 may individually transfer the test data signals PT_DATA from the test device 1300 to a corresponding one of the first and second memory chips 100 and 200 through the first and second test channels PCH1 and PCH2, according to the individual control signals PT_CHSEL<0:1>. The individual control signals PT_CHSEL<0:1> may be chip select signals.

As described above, the test control signal PT_CTRL may be one of the disabled row test signals PT_RAN<0:6> during the column operation, and may be one of the disabled column test signals PT_CAN<0:6> during the row operation. For example, during the active operation or the row operation in the test mode, the active command or the row command may be enabled, and the column test signals PT_CAN<0:6> may be disabled. During the active operation or the row operation in the test mode, the plurality of signal selection units 300 may set the memory device 1100 to the common test mode in response to one of the disabled column test signals PT_CAN<0:6>, and the enabled common test signal TM_2CH. During the active operation or the row operation in the test mode, the plurality of signal selection units 300 may set the memory device 1100 to the individual test mode when one of the disabled column test signals PT_CAN<0:6> is enabled while the common test signal TM_2CH is enabled.

For example, both the first and second memory chips 100 and 200 may commonly perform active operations and precharge operations for the PBT of the first and second memory chips 100 and 200 during the common test mode. Each of the first and second memory chips 100 and 200 may individually perform the write operation and a read operation for the individual test of the first and second memory chips 100 and 200 during the individual test mode.

The first channel selection unit 400 may selectively transfer the test data signals PT_DATA to the first memory chip 100 through the first channel CH1 or the first test channel PCH1. For example, the first channel selection unit 400 may transfer the test data signals PT_DATA from the first signal selection unit 310 to the first memory chip 100 through the first test channel PCH1 when the test mode signal PTEST is enabled. The first normal signals CHI1_SIGS may be transferred from an external (e.g., an outside source or device) to the first memory chip 100 through the first channel CH1 during the normal operation mode.

The second channel selection unit 500 may selectively transfer the test data signals PT_DATA to the second memory chip 200 through the second channel CH2 or the second test channel PCH2. For example, the second channel selection unit 500 may transfer the test data signals PT_DATA from the second signal selection unit 320 to the second memory chip 200 through the second test channel PCH2 when the test mode signal PTEST is enabled. The second normal signals CHI2_SIGS may be transferred from an external to the second memory chip 200 through the second channel CH2 during the normal operation mode.

The first and second memory chips 100 and 200 may selectively receive the test data signals PT_DATA or the first and second normal signals CHI1_SIGS and CHI2_SIGS through the first and second test channels PCH1 and PCH2, or the first and second channels CH1 and CH2 by the first and second channel selection units 400 and 500 according to the operation mode of the semiconductor device 1000.

The test device 1300 may generate and output the test mode signal PTEST, the individual control signals PT_CHSEL<0:1>, the test data signals PT_DATA, and the test control signal PT_CTRL to the first and second memory chips 100 and 200 through the first and second test channels PCH1 and PCH2 for one of the PBT and the individual test of the first and second memory chips 100 and 200 during the common test mode and the individual test mode.

The operation of the semiconductor device 1000 will now be described.

For example, the first and second memory chips 100 and 200 may commonly perform the active operation according to the test data signals PT_DATA except for the disabled column test signals PT_CAN<0:6>, that is, the memory clock test signal PT_CLK, the data input/output test signal PT_DQ<0:7>, the data masking test signal PT_DMI and the row test signals PT_RAN<0:6>, in the common test mode of the test mode when the test mode signal PTEST and the common test signal TM_2CH are enabled. The disabled column test signals PT_CAN<0:6> may be the test control signal PT_CTRL during the active operation in the test mode. The first and second signal selection units 310 and 320 may commonly transfer the test data signals PT_DATA except for the disabled column test signals PT_CAN<0:6>, that is, the memory clock test signal PT_CLK, the data input/output test signal PT_DQ<0:7>, the data masking test signal PT_DMI, and the row test signals PT_RAN<0:6>, from the test device 1300 to the first and second memory chips 100 and 200 through the first and second test channels PCH1 and PCH2 via the first and second channel selection units 400 and 500, respectively, during the active operation in the common test mode.

When an operation parameter, for example the 'tRCD', of each of the first and second memory chips 100 and 200 is to be measured during the active operation or the row operation in the common test mode, one of the disabled column test signals PT_CAN<0:6> or the test control signal PT_CTRL may be enabled while the common test signal TM_2CH is enabled, and accordingly the first and second memory chips 100 and 200 may be set to the individual test mode according to the enabled test control signal PT_CTRL. During the individual test mode, one or more of the first and second memory chips 100 and 200 may be selected according to the individual control signals PT_CHSEL<0:1>, and the selected one of the first and second memory chips 100 and 200 may receive the test data signals PT_DATA except for the row test signals PT_RAN<0:6>, that is, the memory clock test signal PT_CLK, the data input/output test signal PT_DQ<0:7>, the data masking test signal PT_DMI, and the column test signals PT_CAN<0:6>, from the test device 1300 through a corresponding one of the first and second test channels PCH1 and PCH2 via a corresponding one of the first and second signal selection units 310 and 320, which is selected by the individual control signals PT_CHSEL<0:1>, and a corresponding one of the first and second channel selection units 400 and 500.

In accordance with an exemplary embodiment of the present invention, even though during the common test mode while the common test signal TM_2CH is enabled, the first and second memory chips 100 and 200 may individually operate for the individual test of the first and second memory chips 100 and 200 according to the individual control signals PT_CHSEL<0:1> when the test control signal PT_CTRL is enabled.

Thus, the semiconductor device 1000 in accordance with an exemplary embodiment of the present invention may prevent the additional sequence of the prior art for measurement of parameters such as the RAS to CAS delay time 'tRCD' during the individual test of the first and second memory chips 100 and 200, by which a signal for simultaneously selecting the first and second channels should be inactivated, or a signal for separately selecting the first channel or the second channel should be applied. Due to the absence of the additional sequence, loss of time may be prevented and it is possible to correctly measure the parameters of each of the first and second memory chips 100 and 200 even during the PBT.

Figure 2:
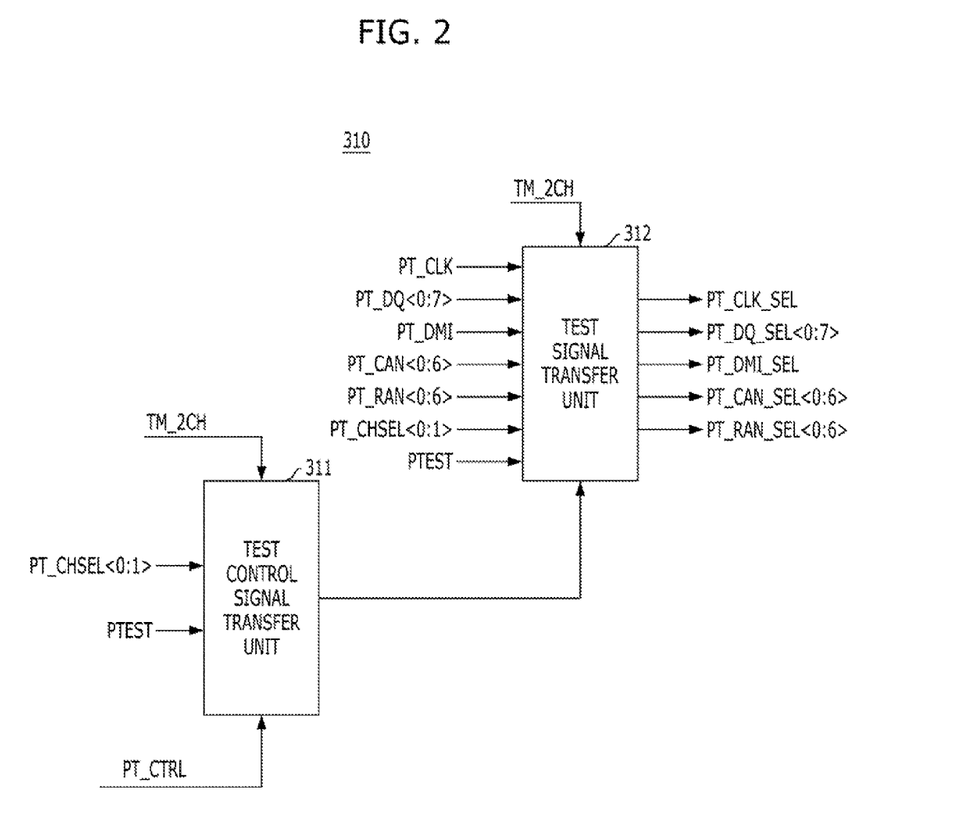
FIG. 2 is a detailed block diagram illustrating a first signal selection unit shown in FIG. 1.

FIG. 2 is a detailed block diagram illustrating the first signal selection unit 310 shown in FIG. 1.

Referring to FIG. 2, the first signal selection unit 310 may include a control signal transfer unit 311 and a test signal transfer unit 312.

As described above, each of the first and second signal selection units 310 and 320 may receive the memory clock test signal PT_CLK, the data input/output test signal PT_DQ<0:7>, the data masking test signal PT_DMI, the row test signals PT_RAN<0:6>, and the column test signals PT_CAN<0:6>. Also, each of the first and second signal selection units 310 and 320 may receive the common test signal TM_2CH, the individual control signals PT_CHSEL<0:1>, the test mode signal PTEST, and the test control signal PT_CTRL, which is one of the disabled row test signals PT_RAN<0:6> during the column operation, which is performed by the enabled column test signals PT_CAN<0:6>, or one of the disabled column test signals PT_CAN<0:6> during the row operation, which is performed by the enabled row test signals PT_RAN<0:6>.

The control signal transfer unit 311 may receive the common test signal TM_2CH the individual control signals PT_CHSEL<0:1>, the test mode signal PTEST, and the test control signal PT_CTRL. The control signal transfer unit 311 may be activated in response to the enabled test mode signal PTEST. During the test mode according to the test mode signal PTEST, the control signal transfer unit 311 may transfer the test control signal PT_CTRL to the test signal transfer unit 312 in response to the combination of the common test signal TM_2CH and the test control signal PT_CTRL.

The test signal transfer unit 312 may transfer the memory clock test signal PT_CLK, the data input/output test signal PT_DQ<0:7>, and the data masking test signal PT_DMI as test output signals, which is PT_CLK_SEL, PR_DQ_SEL<0:7>, and PT_DMI_SEL, to the first channel selection unit 400 in response to the test mode signal PTEST, the individual control signals PT_CHSEL<0:1>, and the common test signal TM_2CH.

Also, the test signal transfer unit 312 may transfer one of the row test signals PT_RAN<0:6> and the column test signals PT_CAN<0:6> as the test output signals PT_RAN_SEL<0:6> or PT_CAN_SEL<0:6> to the first channel selection unit 400 in response to the output signal of the control signal transfer unit 311.

For example, the test signal transfer unit 312 may transfer the row test signals PT_RAN<0:6> to the first channel selection unit 400 in response to the test control signal PT_CTRL, which is the enabled one, for example the column test signal PT_CAN<0>, from the disabled column test signals PT_CAN<0:6> during the active operation in the test mode. For example, the test signal transfer unit 312 may transfer the column test signals PT_CAN<0:6> to the first channel selection unit 400 in response to the test control signal PT_CTRL, which is the enabled one, for example the row test signal PT_RAN<0>, from the disabled row test signals PT_RAN<0:6> during the write or read operation in the test mode.

Figure 3:
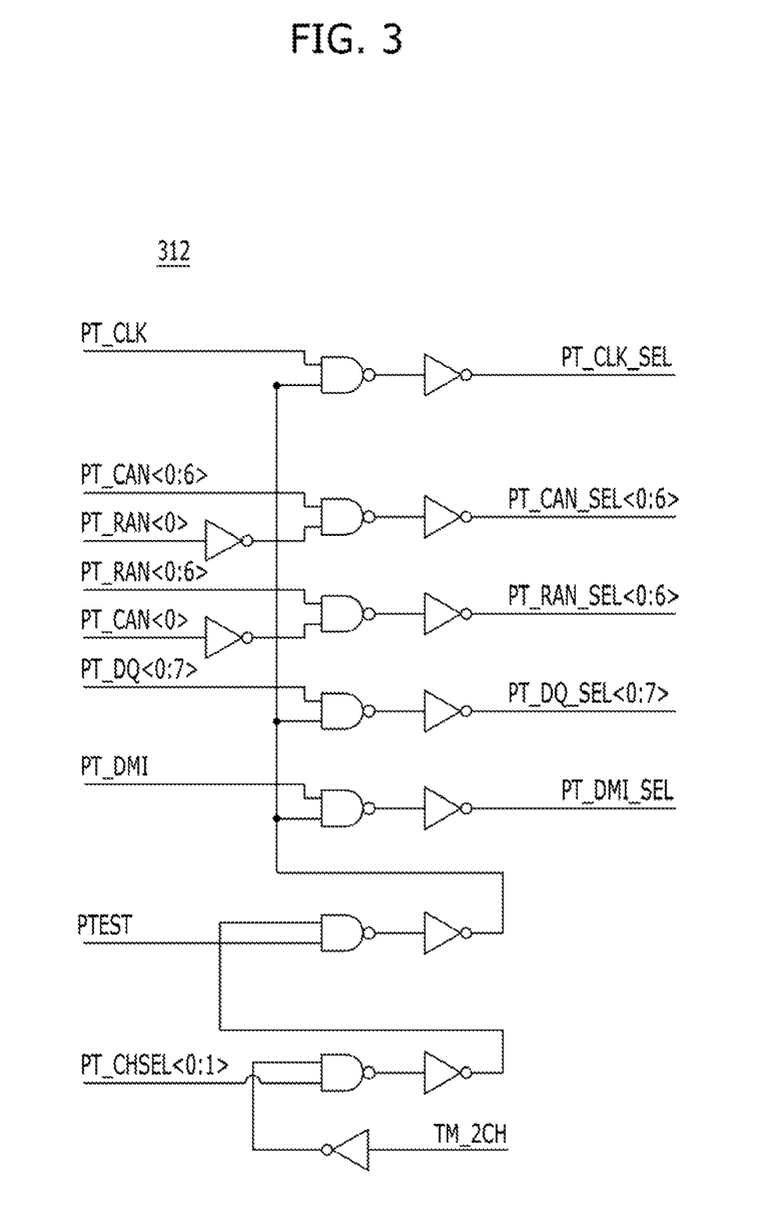
FIG. 3 is a detailed circuit diagram illustrating a signal transfer unit shown in FIG. 2.

FIG. 3 is a detailed circuit diagram illustrating the test signal transfer unit 312 shown in FIG. 2.

The test signal transfer unit 312 may include a plurality of NAND gates and inverters.

The test signal transfer unit 312 may transfer the memory clock test signal PT_CLK, the data input/output test signal PT_DQ<0:7>, and the data masking test signal PT_DMI as test output signals, which are PT_CLK_SEL, PR_DQ_SEL<0:7>, and PT_DMI_SEL, to the first channel selection unit 400 according to the combination of the test mode signal PTEST, the individual control signals PT_CHSEL<0:1>, and the common test signal TM_2CH.

Also, the test signal transfer unit 312 may transfer one of the row test signals PT_RAN<0:6> and the column test signals PT_CAN<0:6> as the test output signals PT_RAN_SEL<0:6> or PT_CAN_SEL<0:6> to the first channel selection unit 400 in response to the test control signal PT_CTRL, which is the enabled one, for example the column test signal PT_CAN<0>, from the disabled column test signals PT_CAN<0:6> during the active operation in the test mode, or whichever is the enabled one, for example the row test signal PT_RAN<0>, from the disabled row test signals PT_RAN<0:6> during the write or read operation in the test mode.

For example, during the active operation or the row operation in the test mode, which is performed by the enabled row test signals PT_RAN<0:6>, the test control signal PT_CTRL may be one of the disabled column test signals PT_CAN<0:6>, for example the column test signal PT_CAN<0>, which is disabled during the row operation.

As shown in FIG. 3, the test signal transfer unit 312 may transfer the memory clock test signal PT_CLK, the data input/output test signal PT_DQ<0:7>, and the data masking test signal PT_DMI as test output signals, which is PT_CLK_SEL, PR_DQ_SEL<0:7>, and PT_DMI_SEL, to the first channel selection unit 400 regardless of the individual control signals PT_CHSEL<0:1> when the test mode signal PTEST, and the common test signal TM_2CH are enabled, and thus the memory device 1100 is set to the common test mode.

During the common test mode, the test signal transfer unit 312 may transfer the row test signals PT_RAN<0:6> as the test output signals PT_RAN_SEL<0:6> to the first channel selection unit 400 when the test control signal PT_CTRL, or the column test signal PT_CAN<0> is disabled, and thus has a logic low level. On the other hand, during the common test mode, the test signal transfer unit 312 may not transfer the row test signals PT_RAN<0:6> as the test output signals PT_RAN_SEL<0:6> to the first channel selection unit 400 when the test control signal PT_CTRL or the column test signal PT_CAN<0> is enabled and thus has a logic high level.

Therefore, even though during the common test mode while the common test signal TM_2CH is enabled, the test signal transfer unit 312 may not transfer the row test signals PT_RAN<0:6> as the test output signals PT_RAN_SEL<0:6> to the first channel selection unit 400 when the test control signal PT_CTRL or the column test signal PT_CAN<0> is enabled.

For example, during the write or read operation or the column operation in the test mode, which is performed by the enabled column test signals PT_CAN<0:6>, the test control signal PT_CTRL may be one of the disabled row test signals PT_RAN<0:6>, for example the row test signal PT_RAN<0>, which is disabled during the column operation.

As shown in FIG. 3, the test signal transfer unit 312 may transfer the memory clock test signal PT_CLK, the data input/output test signal PT_DQ<0:7>, and the data masking test signal PT_DMI as test output signals, which are PT_CLK_SEL, PR_DQ_SEL<0:7>, and PT_DMI_SEL, to the first channel selection unit 400 regardless of the individual control signals PT_CHSEL<0:1> when the test mode signal PTEST and the common test signal TM_2CH are enabled, and thus the memory device 1100 is set to the common test mode.

During the common test mode, the test signal transfer unit 312 may transfer the column test signals PT_CAN<0:6> as the test output signals PT_CAN_SEL<0:6> to the first channel selection unit 400 when the test control signal PT_CTRL, or the row test signal PT_RAN<0> is disabled, and thus has a logic low level. On the other hand during the common test mode, the test signal transfer unit 312 may not transfer the column test signals PT_CAN<0:6> as the test output signals PT_CAN_SEL<0:6> to the first channel selection unit 400 when the test control signal PT_CTRL, or the row test signal PT_RAN<0> is enabled, and thus has a logic high level.

Therefore even though during the common test mode while the common test signal TM_2CH is enabled, the test signal transfer unit 312 may not transfer the column test signals PT_CAN<0:6> as the test output signals PT_CAN_SEL<0:6> to the first channel selection unit 400 when the test control signal PT_CTRL, or the row test signal PT_RAN<0> is enabled.

Figure 4A:
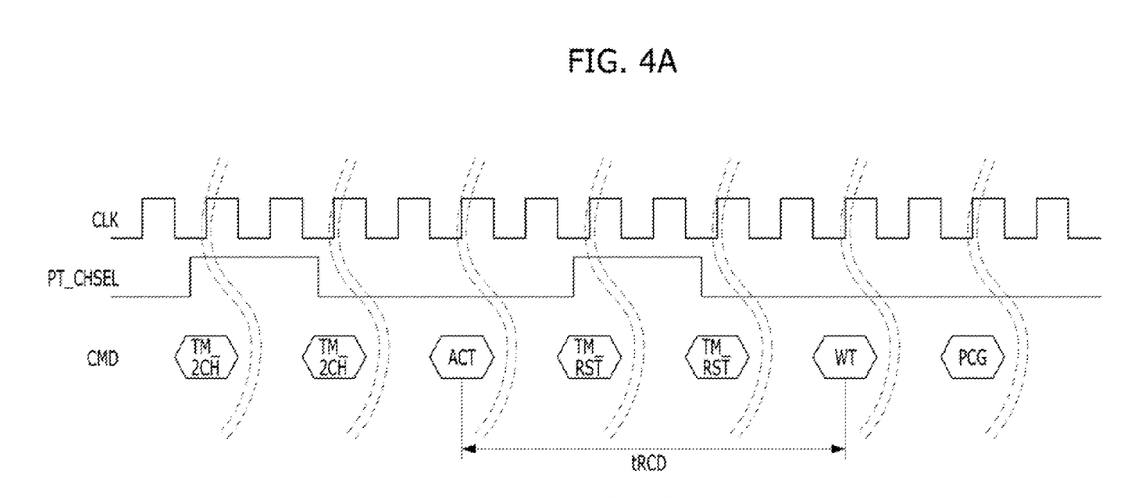
FIGS. 4A and 4B are timing diagrams illustrating operations of memory devices in accordance with prior art and an exemplary embodiment of the present invention.
Figure 4B:
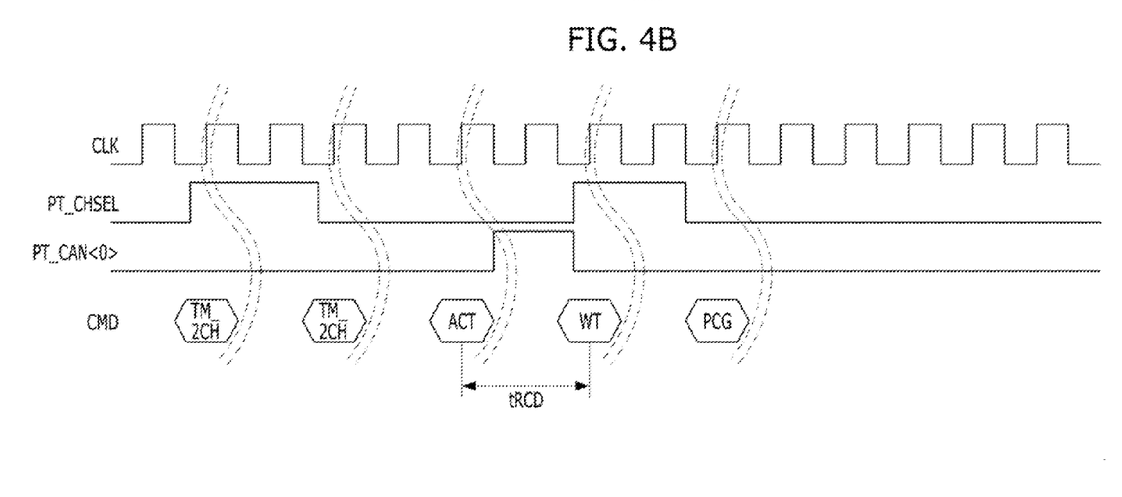

FIGS. 4A and 4B are timing diagrams illustrating operations of memory devices in accordance with prior art and an exemplary embodiment of the present invention, respectively.

Referring to FIG. 4A, the memory device in accordance with prior art is set to the common test mode upon receiving the common test signal TM_2CH, and then, the memory device performs the active operation upon receiving the active command. After that, the memory device requires the additional sequence, or a common mode reset signal TM_RST for disabling the common test signal TM_2CH, and individual control of the memory chips in the memory device in order to measure the operation parameters, for example, the 'tRCD', and thus requires additional time for the additional sequence. As shown in FIG. 4A, it is impossible to measure the operation parameter 'tRCD' due to the additional time required for the additional sequence TM_RST.

Referring to FIG. 4B, the memory device 1100 in accordance with an exemplary embodiment of the present invention may be set to the common test mode upon receiving the common test signal TM_2CH while the test control signal PT_CTRL is disabled, and then, the first and second memory chips 100 and 200 in the memory device 1100 may commonly perform the active operation upon receiving the active command during the common test mode. The first and second memory chips 100 and 200 may be set to the individual test mode upon receiving the enabled test control signal PT_CTRL or the enabled column test signal PT_CAN<0>, and may be selected by the individual control signals PT_CHSEL<0:1> upon receiving the write command in order to measure the operation parameter 'tRCD' of the selected one of the first and second memory chips 100 and 200. Therefore, it is possible to individually measure the operation parameters of the selected one of the first and second memory chips 100 and 200 through the individual write operation of the selected one of the first and second memory chips 100 and 200 even though it is during the common test mode while the common test signal TM_2CH is enabled.

Thus the first and second memory chips 100 and 200 may execute not only the common test mode but also the individual test mode without the additional time for the additional sequence. That is, it is possible to correctly measure the operation parameters of each of the memory chips without the additional time for the additional sequence even during the parallel bit test (PBT).

Meanwhile, although multi chips are exemplarily described in the exemplary embodiments of the present invention, in another embodiment of the present invention, a multi rank for a parallel test and a test method thereof will be implemented. Herein the multi rank may use at least one independent channel, which shares a second pin information, e.g., addresses and clock signals, except for a first pin information, e.g., a chip selection information or a slice information.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
   a plurality of memory chips; and
   a plurality of signal selection units respectively corresponding to the plurality of memory chips, and suitable for commonly transferring test data signals from an external to a corresponding one of the plurality of memory chips during a common test mode,
   wherein one or more of the plurality of signal selection units transfer the test data signals from the external to corresponding ones of the plurality of memory chips during an individual test mode, and
   wherein the semiconductor device is set to the common test mode when a common test signal is enabled, and set to the individual test mode when both the common test signal and a test control signal are enabled.

2. The semiconductor device of claim 1, wherein the test control signal is one of multiple row test signals initially disabled during a column operation, which one of the plurality of memory chips performs when multiple column test signals are enabled, and
   wherein the test control signal is one of the multiple column test signals initially disabled during a row operation, which one of the plurality of memory chips performs when the multiple row test signals are enabled.

3. The semiconductor device of claim 2, wherein the column operation is one of write and read operations, and
   wherein the row operation is an active operation.

4. The semiconductor device of claim 2, wherein one of the plurality of memory chips is selected in response to chip select signals, and
   wherein one of the plurality of signal selection units transfers the test data signal to a corresponding one of the plurality of memory chips selected in response to chip select signals during the individual test mode.

5. The semiconductor device of claim 2, wherein each of the plurality of signal selection units transfers the enabled multiple column test signals in response to the test control signal, which is one of multiple row test signals initially disabled, and becomes enabled during the column operation, and
   wherein each of plurality of signal selection units transfers the enabled multiple row test signals in response to the test control signal, which is one of multiple column test signals initially disabled, and becomes enabled during the row operation.

6. A semiconductor device, comprising:
   a memory device; and
   a test device suitable for transferring test data signals to the memory device during a test mode,
   wherein the memory device comprises:
   a plurality of memory chips; and
   a plurality of signal selection units respectively corresponding to the plurality of memory chips, and suitable for commonly transferring test data signals from the test device to a corresponding one of the plurality of memory chips during a common test mode,
   wherein one or more of the plurality of signal selection units transfer the test data signals from the test device to corresponding ones of the plurality of memory chips during an individual test mode, and
   wherein the semiconductor device is set to the common test mode when a common test signal is enabled, and set to the individual test mode when both the common test signal and a test control signal are enabled.

7. The semiconductor device of claim 6, wherein the test control signal is one of multiple row test signals initially disabled during a column operation, which one of the plurality of memory chips performs when multiple column test signals are enabled, and
   wherein the test control signal is one of the multiple column test signals initially disabled during a row operation, which one of the plurality of memory chips performs when the multiple row test signals are enabled.

8. The semiconductor device of claim 7, wherein the column operation is one of write and read operations, and
   wherein the row operation is an active operation.

9. The semiconductor device of claim 7, wherein one of the plurality of memory chips is selected in response to chip select signals, and
   wherein one of the plurality of signal selection units transfers the test data signal to a corresponding one of the plurality of memory chips selected in response to chip select signals during the individual test mode.

10. The semiconductor device of claim 7, wherein each of the plurality of signal selection units transfers the enabled multiple column test signals in response to the test control signal, which is one of multiple row test signals initially disabled, and becomes enabled during the column operation, and
    wherein each of the plurality of signal selection units transfers the enabled multiple row test signals in response to the test control signal, which is one of multiple column test signals initially disabled, and becomes enabled during the row operation.

11. A method of testing a semiconductor device having a plurality of memory chips, and a plurality of signal selection units respectively corresponding to the plurality of memory chips, comprising:
    setting the semiconductor device to a common test mode when a common test signal is enabled;
    at the plurality of signal selection units, commonly transferring test data signals from an external to a corresponding one of the plurality of memory chips during the common test mode;
    setting the semiconductor device to an individual test mode when both the common test signal and a test control signal are enabled; and
    at one or more of the plurality of signal selection units, transferring the test data signals from the external to corresponding ones of the plurality of memory chips during an individual test mode.

12. The method of claim 11, wherein the test control signal is one of multiple row test signals initially disabled during a column operation, which one of the plurality of memory chips performs when multiple column test signals are enabled, and wherein the test control signal is the multiple column test signals initially disabled during a row operation, which one of the plurality of memory chips performs when the multiple row test signals are enabled.

13. The method of claim 12, wherein the column operation is one of write and read operations, and wherein the row operation is an active operation.

14. The method of claim 12, wherein one of the plurality of memory chips is selected in response to chip select signals, and wherein the transferring of the test data signals at one or more of the plurality of signal selection units transfers the test data signal at one of the plurality of signal selection units to a corresponding one of the plurality of memory chips selected in response to chip select signals during the individual test mode.

15. The method of claim 12, wherein the transferring of the test data signals at one or more of the plurality of signal selection units transfers the enabled multiple column test signals at each of plurality of signal selection units in response to the test control signal, which is one of multiple row test signals initially disabled, and becomes enabled during the column operation, and wherein the transferring of the test data signals at one or more of the plurality of signal selection units transfers the enabled multiple row test signals at each of plurality of signal selection units in response to the test control signal, which is one of multiple column test signals initially disabled, and becomes enabled during the row operation.

* * * * *